United States Patent [19]

Gibson et al.

[11] 4,241,452
[45] Dec. 23, 1980

[54] AUTOMATIC FREQUENCY CONTROL SYSTEM

[75] Inventors: Rodney W. Gibson, Burgess Hill; Raymond Wells, Redhill, both of England

[73] Assignee: U.S. Philips Corporation, New York, N.Y.

[21] Appl. No.: 960,531

[22] Filed: Nov. 14, 1978

[30] Foreign Application Priority Data

Nov. 23, 1977 [GB] United Kingdom .......... 48753/77

[51] Int. Cl.³ .............................................. H04B 1/26
[52] U.S. Cl. ................................... 455/203; 455/263
[58] Field of Search ............... 325/50, 63, 329, 330, 325/17, 418, 420, 422, 423; 455/71, 75, 46, 47, 257, 258, 261, 263, 264, 202, 203

[56] References Cited

U.S. PATENT DOCUMENTS

| | | | |
|---|---|---|---|
| 2,494,751 | 1/1950 | Forster | 325/423 |
| 2,730,614 | 1/1956 | Wheeler | 325/423 |
| 2,915,626 | 12/1959 | Freedman | 325/423 |
| 3,084,328 | 4/1963 | Groeneveld et al. | 325/418 |

*Primary Examiner*—Marc E. Bookbinder
*Attorney, Agent, or Firm*—Thomas A. Briody; William J. Streeter; Edward W. Goodman

[57] ABSTRACT

Automatic frequency control (afc) particularly for single sideband (SSB) receiving systems.

In a SSB receiving system, fine tuning is carried out using an afc loop. In one embodiment the loop includes a frequency discriminator for measuring the frequency of a composite i.f. signal (pilot carrier and modulating signal) and producing a waveform having an amplitude corresponding to the measured frequency. The amplitude waveform comprises the pilot carrier interspersed by the modulating signal. The frequency of the pilot carrier is measured using a peak detecting circuit and this measurement is used to automatically fine tune the receiver.

10 Claims, 4 Drawing Figures

AUTOMATIC FREQUENCY CONTROL SYSTEM

BACKGROUND OF THE INVENTION

The present invention relates to automatic frequency control (afc) in receiving systems particularly single sideband (SSB) receiving systems. Such receiving systems may be used as radio receivers in vehicles such as land-mobiles, boats and aircraft.

SSB radio is used for economising on bandwidth and transmitter power.

A significant problem to be overcome is to ensure that the local oscillator frequency is such that after it has been mixed with the incoming signal, the correct intermediate frequency (i.f.) is obtained.

One technique would be to use high precision and substantially drift-free crystal controlled oscillators. However such precision oscillators would be so expensive as to render them uneconomical for use in commercial equipment. Further, the higher the frequency, the greater the drift in actual cycles/second (Hz), thus a drift of 1 part in $10^6$ is equivalent to 10 Hz at 10 MHz, 100 Hz at 100 MHz and 500 Hz at 500 MHz. Thus the higher the carrier frequency the greater the effect of drift on the demodulated signal. Accordingly some form of automatic frequency control (afc) system is necessary particularly with v.h.f. and u.h.f. equipment for use in vehicles, to take into account not only frequency drift in oscillators but also frequency shift which may occur in the transmitted signal.

SSB techniques may also be used in cable wire or optical signal transmission systems and the techniques herein described could also be applied to these systems.

One automatic frequency control system is disclosed in "Proceedings of the IRE" December 1956 Vol. 44 pages 1854–1873 "Single-Sideband Techniques in U.H.F. Long-Range Communications" by W. E. Morrow, Jr; C. L. Mack, Jr; B. E. Nichols and J. Leonard. This a.f.c. system requires that a 16 MHz pilot carrier, which frequency is also that of a suppressed subcarrier, be transmitted with the modulating signal, both signals being mixed with a u.h.f. carrier. The level of the pilot carrier is 10 db below the peak level of the modulating signal to save transmitter power. In a receiver the pilot carrier is used to provide an afc voltage for a local oscillator, a reference carrier for demodulating the signal, and a voltage for automatic gain control.

In order to provide the afc voltage, the output of an intermediate frequency (i.f.) amplifier is supplied to a first pilot filter the output of which is connected to a second pilot filter and to one input of a phase discriminator. The output of the second filter is connected to a 16 MHz demodulator and to a second input of the phase discriminator. The pilot filters and the phase discriminator produce an afc signal that corrects the local oscillator frequency to keep the pilot carrier centered within the filters. A shortcoming of this known circuit is that the receiver tuning tolerance is typically ±200 Hz and is dependent on the filter used to extract the carrier. Accordingly if due to transmitter drift or frequency shift the pilot carrier moves outside the filter range of ±200 Hz, the afc circuit may not pull the receiver into the center of the filter and may even lock on to the modulating signal, for example, speech, causing the receiver to be detuned. The problem could be eliminated if the receiver tuning tolerance could be increased.

Another automatic frequency control system for SSB radio is disclosed in "The Radio and Electronic Engineer" Vol. 46 No. 2 pages 69–75, February 1976. In the system described, the carrier is suppressed at the transmitter and no pilot carrier is transmitted, only the modulating signal. A carrier having the same or substantially the same frequency as the transmitter carrier has to be generated in the receiver so that demodulation can take place. In order to be able to generate a carrier of the desired frequency in the receiver it is necessary to be able to detect and correct for any frequency shift which may have occurred during transmission. The SSB system described is based on the detection of inaudible distortion introduced into the modulating signal at the transmitter. The distortion comprises introducing a narrow stop band into the middle of the speech spectrum. In the receiver two band-pass filters are provided. The filters have a narrow pass-band and are centered on either side of the stop band. The outputs of the filters are rectified and combined to produce an automatic frequency control (afc) signal which is used to control the frequency of a local oscillator used in the generation of the carrier frequency. In operation if no frequency shift of the transmitted signal has taken place then the filter outputs are equal and the local oscillator output remains unchanged. If frequency shift does occur within the frequency band bounded by the center frequencies of the filters, an afc signal of appropriate amplitude and polarity related to the amount and direction of the frequency shift from stop-band is produced and is used to adjust the local oscillator frequency accordingly. A limitation of this known SSB system is the range of frequency shift that is able to cope with successfully. On the one hand the stop band introduced in the transmitted signal cannot be too wide because it may impair seriously the modulating signal, which may be speech, and on the other hand if the center frequencies of the filters are spaced too far apart then their outputs would be affected adversely by their passing some of the modulating signal which distorts the afc signal and thereby the frequency of the local oscillator. Hence a compromise has been made in the known system and a lock-in range of ±400 Hz is considered practicable. This lock-in range is considered too narrow for satisfactory operation of land-mobiles in built-up and forest areas where the frequency shift may be greater. Furthermore this known system which is complicated and has so far not been entirely satisfactory in practice, has not been evaluated at V.H.F. and U.H.F. carrier frequencies.

The local oscillators in SSB receivers are usually crystal controlled oscillators. Commercially available crystals at economic prices typically produce a drift of ±5 parts in $10^6$. Such a drift is equivalent to ±500 Hz at 100 MHz. Amateur radio equipment is usually equipped with a manually controlled fine tuner, known as a clarifier, which is adjusted to pull-in a received signal and thereby overcome the problems of frequency shift and frequency drift. However the provision of clarifiers in equipment for use in vehicles, for example, land-mobiles, boats and aircraft, is unacceptable because it would distract the operator, particularly if it is a one-man operated vehicle.

Accordingly it is desired to overcome the shortcomings of the prior art equipment and improve the frequency tolerance of SSB receiving system particularly when operated at v.h.f. and u.h.f. frequencies as well as at h.f. frequencies.

SUMMARY OF THE INVENTION

According to the present invention there is provided an automatic frequency control (afc) system including a signal frequency translation means having a first input for an input signal including a pilot signal and a modulation signal and a second input for a control signal, and an afc circuit comprising means for determining the minimum (or maximum) value of a waveform having an amplitude corresponding to the frequency of the input signal and providing an afc signal in response to the determined minimum (or maximum) value, which afc signal is coupled to the second input of the frequency translating means so as to control appropriately the amount of frequency translation.

According to another aspect of the present invention there is provided a single sideband receiver comprising a mixer having an input for a received signal including a pilot carrier and a modulating signal and another input coupled to a local oscillator, an automatic frequency control (afc) circuit for the local oscillator, wherein the afc circuit comprises an input for receiving a signal from the mixer and means for determining the minimum (or maximum) value of a waveform corresponding to the apparent frequency of the whole signal applied to the afc circuit input and providing an afc voltage in response to the determined minimum (or maximum) value.

In an embodiment of a SSB receiver in accordance with the present invention the i.f. signal is converted into a signal having an amplitude corresponding to the i.f. signal, which signal includes portions derived from the modulating signal, for example speech, interspersed with portions derived from the pilot carrier during pauses in the modulating signal. Depending on whether upper or lower sideband is being transmitted the portion derived from the pilot carrier comprises either a minimum or a maximum. By determining the minimum (or maximum) value of the amplitude waveform a corresponding afc signal can be produced.

The value determining means may comprise a frequency discriminator circuit for producing the amplitude waveform and a peak detecting circuit coupled to an output circuit of the discriminator for determining the minimum (or maximum) value.

In order to remove noise from the amplitude waveform, it may be filtered in a low pass filter. The filter may be incorporated in the frequency discriminator or it may be provided in the feedback path of an operational amplifier connecting the output of the frequency discriminator to the peak detecting circuit. Such an amplifier may be necessary if the output voltage swing of the discriminator is insufficient to operate the subsequent circuits.

The peak detecting circuit may comprise a diode and a capacitor connected to one electrode of the diode, the other electrode of which is connected to receive the filtered apparent frequency signal.

The present invention also relates to a SSB communications system including a transmitter adapted to transmit a pilot carrier and modulating signal modulated on a main carrier signal and a receiver in accordance with the present invention.

If desired the transmitter may include signal blanking means for intermittently blanking-out the modulating signal so that only the pilot carrier is transmitted during the blanking interval or means to enhance intermittently the pilot carrier so as to dominate the transmitted signal.

The present invention will now be described, by way of example, with reference to the accompanying drawings, wherein:

DESCRIPTION OF THE PREFERRED EMBODIMENT

Figure 1:
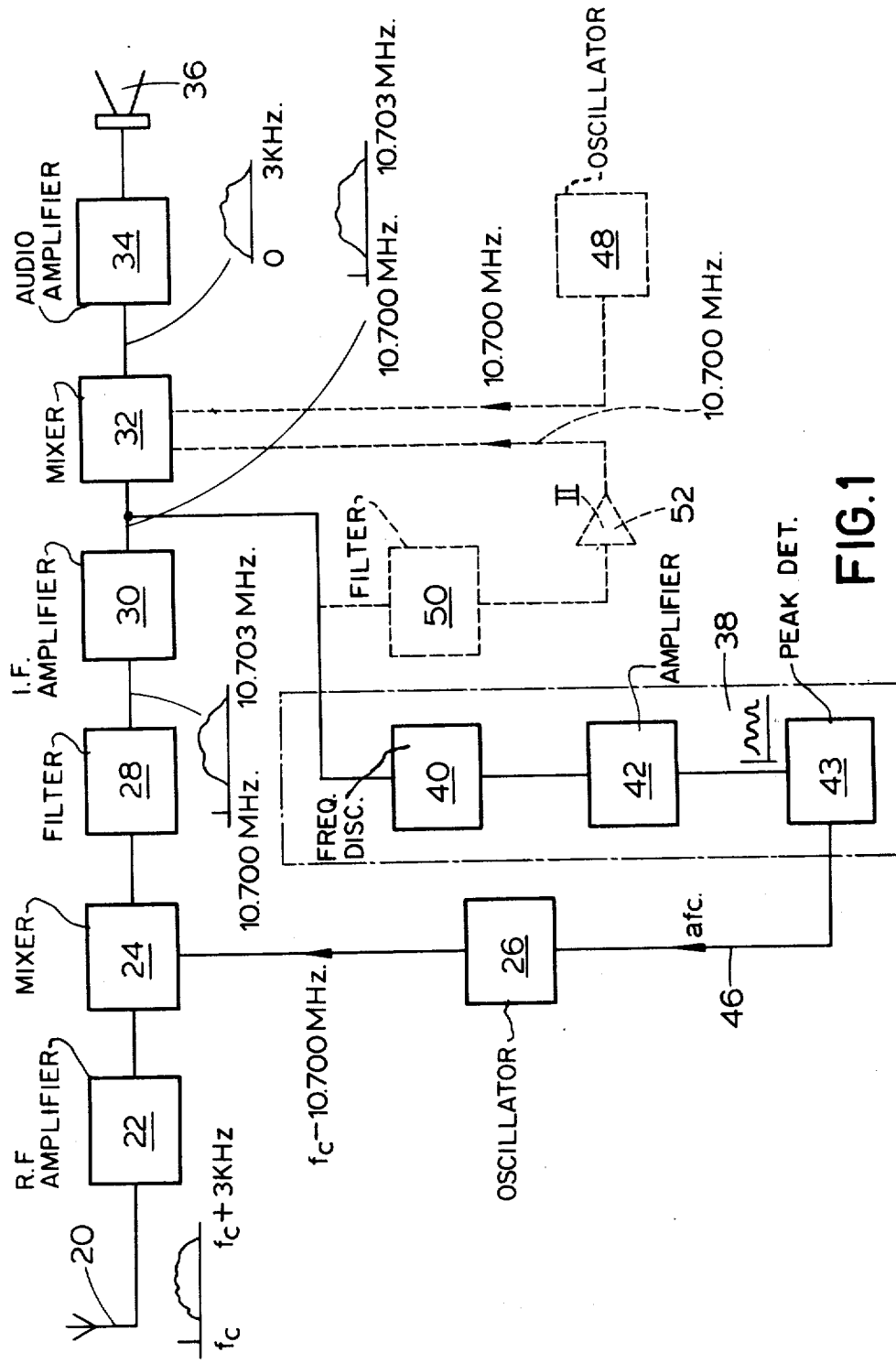
FIG. 1 is a block schematic diagram of an embodiment of a single sideband receiver in accordance with the invention.

Before discussing FIG. 1 in detail, it is pointed out that the invention is shown as applied to a radio receiver and the frequencies and bandwidths mentioned are purely exemplary and further the number of i.f. amplifying stages is chosen to suit the frequencies being used and could in some cases be omitted altogether. However in the receiver of FIG. 1 it is assumed that the carrier, $f_c$, and pilot carrier are both 100 MHz, the i.f. is 10.7 MHz and the modulating signal is speech within the band 300 to 3000 Hz. Further the parts shown in broken lines are alternatives with only one or the other being present.

The receiver comprises an aerial or antenna 20 which is connected to an r.f. amplifier 22. The aerial 20 receives a signal in the band $f_c$ to $F_c + 3$ KHz. An output of the r.f. amplifier is connected to a first mixer 24 which has an input connected to a local oscillator 26 which provides a frequency $f_c - 10.7$ MHz. The first mixer 24 and the local oscillator 26 together comprise a form of signal frequency translation means. An output of the mixer 24 is connected to a crystal filter 28 having a passband 10.700 to 10.703 MHz. The pilot carrier now has a frequency of 10.700 MHz. An i.f. amplifier 30 is connected to the crystal filter 28 output and to a second mixer 32. The i.f. signal is supplied to the second mixer 32 from which an audio signal in the band 300 Hz to 3 KHz is obtained. The audio signal is amplified in an audio amplifier 34 and supplied to an audio transducer, for example a loudspeaker 36.

In order to control the output frequency, $f_c - 10.7$ MHz, of the local oscillator 26, and afc circuit 38 is provided. The circuit 38 comprises a frequency discriminator 40, the output of which is connected to an amplifying circuit 42. An output of the amplifying circuit 42, is connected to a peak detecting circuit 43 the output of which is connected by a line 46 to the local oscillator 26. The detailed operation of the afc circuit 38 will be described later with reference to FIGS. 2 and 4.

The pilot carrier of 10.7 MHz may be derived in one of two ways. In one way a 10.7 MHz oscillator 48 is connected to the second mixer 32. In the second way, the signal from the i.f. amplifier 30 is filtered in a pilot carrier filter 50 having a typical pass band of 10.699800 to 10.700200 MHz. The recovered carrier signal is amplified in amplifier 52 and fed to the second mixer 32.

Apart from the operation of the afc circuit 38, the operation of the remainder of the receiver should be self-evident to a person skilled in the art having regard to the foregoing description and the inset waveform diagrams in FIG. 1, and therefore the operation will not be given in detail.

Figure 2:
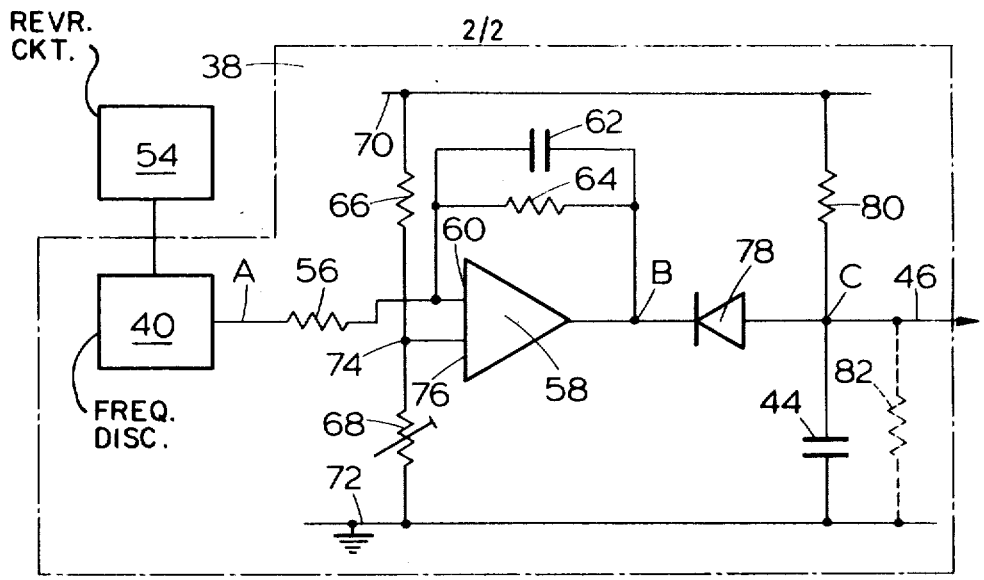
FIG. 2 is a schematic circuit diagram of an embodiment of a circuit for obtaining an afc voltage.

In FIG. 2 the afc circuit 38 is shown in chain-dot lines and the remainder of the receiver by the box marked 54. The i.f. signal is supplied to the frequency discriminator 40 which may comprise any suitable known discriminator. The output of the frequency discriminator 40 is connected by way of a resistor 56 to a first, inverting input 60 of an operational amplifier 58. A parallel combination of a capacitor 62 and a resistance 64 is connected between an output of the amplifier 58 and its input 60 to form a low pass filter. A voltage divider circuit comprising a resistance 66 and a preset resistance 68 is connected between supply lines 70 and 72. A tapping 74 of the voltage divider circuit is connected to a second, non-inverting input 76 of the amplifier 58. The voltage at the tapping 74 forms the pivot point of the amplifier 58. A peak detecting circuit 43 is connected to the output of the amplifier 58. The peak detecting circuit 43 comprises a diode 78 having its cathode connected to the output of the amplifier 58 and its anode connected to a node or junction C of a capacitor 44 connected to supply line 72 and a resistance 80 which is connected to the rail supply line 70. The resistance 80 determines the rate at which the capacitor 44 charges up when diode 78 is cut off. If desired another resistance 82 may be connected in parallel with the capacitor 44. The afc voltage line 46 is connected to the junction C.

Figure 3:
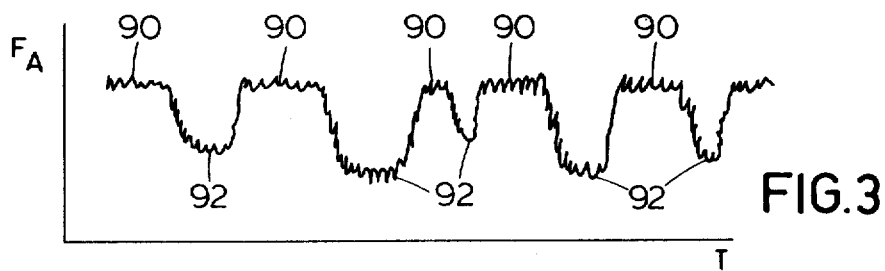
FIG. 3 is a diagram of a waveform which may occur at A in FIG. 2.

In order to understand the operation of the afc circuit 38 it is first necessary to discuss the waveform appearing at the output A of the frequency discriminator 40. The waveform is shown in FIg. 3 and has an amplitude representative of the frequency of the composite signal appearing at the output of the i.f. amplifier 30. This waveform essentially comprises two parts, substantially constant portions 90 corresponding to the frequency of the pilot carrier at the i.f. amplifier 30 output, namely 10.7 MHz, interspersed by portions 92 corresponding the modulating signal, for example speech. The portions 90 occur during pauses in the modulating signal, for example due to pauses between a speakers words. The amplitude of the waveform during these pauses corresponds to the i.f. of the pilot carrier. It has been realised that if the base-line signal, that is the portions 90, can be extracted then this could be used to provide an afc voltage for controlling the frequency of the local oscillator 26 (FIG. 1).

Figure 4:
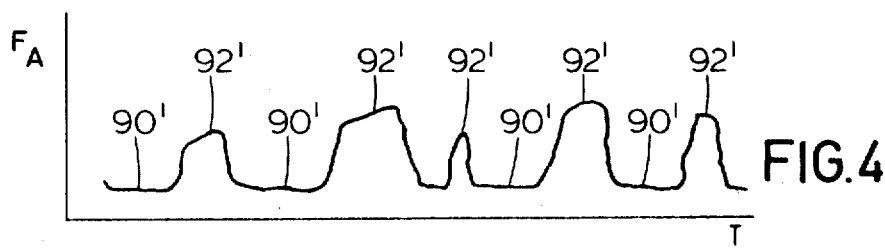
FIG. 4 is a diagram of a waveform which may occur at B in FIG. 2.

In the embodiment of FIG. 2 this is done by supplying the output A of the frequency discriminator 40 to the inverting input 60 of the operational amplifier 58 which forms a low pass filter due to its feedback network. The purpose of the amplifier 58 is to produce a signal having sufficient voltage swing to operate the peak detecting circuit 43 and provide an afc voltage. The filter network 62 and 64 reduces any noise on waveform A; the values must be chosen to maintain the shape of the waveform at B (FIG. 4) at least with respect to portions 90'. A phase inversion also occurs across the amplifier 58. FIG. 4 shows the phase-inverted, cleaned-up waveform occurring at the output of the amplifier, at point B. The portions of the waveform in FIG. 4 corresponding to those of FIG. 3 are indicated with primed references.

In order to obtain the afc voltage, it is necessary to extract the base line portions 90' of the waveform at B. The diode 78 and capacitance 44 enable the required extraction to be made. During the portions 90' of the waveform, the diode is conductive and the charge on the capacitance 44 decreases until C is one diode forward voltage above B at which time the diode ceases to conduct. The diode is reversed biassed during the portions 92' and the charge on the capacitance slowly builds-up via resistance 80. Because of the relatively high value of the capacitance the changes in voltage at the junction C during the portions 92' are smoothed-out and the afc voltage is substantially determined by the level of the portions 90'.

If for some reason the pilot carrier frequency should vary within a preset tolerance range, the waveform A supplied by the frequency discriminator, will be of the same general shape but its level will have varied relative to the pivot point voltage of the amplifier 58, which voltage is determined by the resistance 66 and the preset resistance 68. By way of example, if the upper sideband is being transmitted and if the pilot carrier frequency should increase relative to the center frequency of the tolerance range then the level of the waveform A will decrease relative to the pivot point voltage and if the pilot carrier frequency should decrease below the center frequency of the tolerance range then the level of the waveform A will increase relative to the pivot point voltage. The effect of this shift of level is that the charge on the capacitance 44 will vary in such a way that the afc voltage at the junction C changes to adjust the local oscillator frequency accordingly and restore the pilot carrier frequency to the center of the tolerance range.

In the case of the embodiment of FIG. 2, the following components and values have been used for a SSB receiver operating at V.H.F.

| | |
|---|---|
| Voltage line 70 | + 12 volts |
| Voltage-rail line 72 | 0 volts |
| Frequency Discriminator | TCA 420 with 10.6985 MHz crystal |
| Operational Amplifier 58 | TCA 520B |
| Diode 78 | BAW 62 |
| Resistance 56 | 10 K |
| Resistance 64 | 200 K |
| Resistance 66 | 4.7 K |
| Resistance 80 | 100 K |
| Preset Resistance 68 | 10 K |
| Capacitance 44 | 220 μF |
| Capacitance 62 | 47 nF |
| Closed loop gain of afc loop | 50 |

Although one embodiment of the present invention has been described, various modifications may be made within the scope of the appended claims.

The amplifier 58 and low pass filter may be omitted if the output of the frequency discriminator provides adequate voltage swing and a suitable time constant.

If the waveforms at the points A and B, FIGS. 3 and 4, are inverted, then the diode 78 will be poled the other way around and the capacitance 44 and the resistance 80 will be reversed so that the capacitance is connected to the line 70 and the resistance 80 to ground, line 72. In such a circuit arrangement the portions corresponding to 90' will be at a maximum, rather than a minimum as in FIG. 4.

The capacitance 44, diode 78 and resistance 80 which effectively form a peak detecting circuit may be replaced by any other suitable circuit which is able to measure the portions 90' of the waveform at B.

In the case of a radio receiver having more than one i.f. stage, the afc circuit 38 may be connected to the output of any one of the i.f. stages although the last i.f. stage is preferred.

Provided that the frequency discriminator output is not swamped by the modulating signal so that no portions 90 appear, then the receiver can work well within the tolerance range ±1000 Hz and to more than ±2 KHz with a sufficiently strong signal.

In cases where there are no natural pauses in the modulating signal, for example if the microphone on the transmitter is in a noisy environment, then in order to ensure that the pilot carrier can prevail for a few milliseconds at regular intervals in each second, signal blanking means may be provided in the transmitter to intermittently blank-out the modulating signal. Such signal blanking means may comprise an astable multivibrator driving an analogue gate or switch which gates the microphone amplifier for say 5 mS, four times a second. The analogue gate or switch may comprise a quarter of HEF 4066P or a transistor such as a BSV 81. Alternatively a circuit could be employed which only blanks the signal if no natural pause appears within a certain time. Such a circuit could be easily constructed by one skilled in the art using for example a retriggerable monostable circuit such as HEF 4528.

As an alternative to blanking the modulating signal it can be arranged to increase intermittently the level of the pilot carrier transmitted so as to suppress the modulating signal.

Although the present invention has been described with reference to a closed loop system, it could be used with an open loop system in which the afc signal may control the frequency translation in the signal frequency translation means in some other manner than pulling the i.f. back to its nominal frequency.

What we claim is:

1. An automatic frequency control (afc) system comprising a signal frequency translation means, having a first input for an input signal including a pilot signal and a modulated signal, a second input for a control signal and an output providing a frequency translated input signal, and an afc circuit having first means for providing a waveform whose amplitude depends on the frequency of said translated output signal and second means for determining the minimum (or maximum) value of said waveform for providing an afc signal in response to the determined minimum (or maximum) value, said value determining means being coupled to the second input of the frequency translating means so as to control appropriately the amount of frequency translation.

2. A system as claimed in claim 1, wherein the first means comprises a frequency discriminator circuit for providing the amplitude waveform and said second means comprises a peak detecting circuit coupled to an output circuit of the discriminator for determining the minimum (or maximum) value of the amplitude waveform.

3. A system as claimed in claim 2, wherein the peak detecting circuit comprises a diode, one electrode of which is coupled to the output circuit of the discriminator and the other electrode of which is connected to a junction of a capacitance and a resistance, the afc signal being derived from said junction.

4. A single sideband receiver comprising a mixer having an input for a received signal including a pilot carrier and a modulated signal and another input coupled to a local oscillator to provide a frequency translated received signal, and an automatic frequency control (afc) circuit for controlling the local oscillator, wherein the afc circuit comprises first means for receiving said frequency translated received signal from the mixer and providing a waveform whose amplitude depends on the frequency of said translated input signal and second means for determining the minimum (or maximum) value of said waveform for providing an afc voltage to said local oscillator in response to the determined minimum (or maximum) value.

5. A receiver as claimed in claim 4, wherein the first means comprises a frequency discriminator circuit for providing the amplitude waveform and the second means comprises a peak detecting circuit coupled to an output circuit of the discriminator for determining the minimum (or maximum) value of the amplitude waveform.

6. A receiver as claimed in claim 5, further comprising a low pass filter for filtering the amplitude waveform prior to its being applied to the peak detecting circuit.

7. A receiver as claimed in claim 5, which further comprises an operational amplifier including a low pass filter connected between the frequency discriminator output and the peak detecting circuit.

8. A receiver as claimed in claim 7, which further comprises a potential divider network, a tapping of which is connected to an input of the operational amplifier, the voltage at said tapping being a threshold level of the operational amplifier.

9. A receiver as claimed in any one of claims 5 to 8, wherein the peak detecting circuit comprises a diode, one electrode of which is coupled to the output circuit of the discriminator and the other electrode of which is connected to a junction of a capacitance and a resistance, the afc voltage being derived from said junction.

10. A receiver as claimed in claim 9, wherein another resistance is connected in parallel with the capacitor.

* * * * *